Nov. 5, 1963 R. L. BATDORF ETAL 3,109,758
IMPROVED TUNNEL DIODE
Filed Oct. 26, 1959
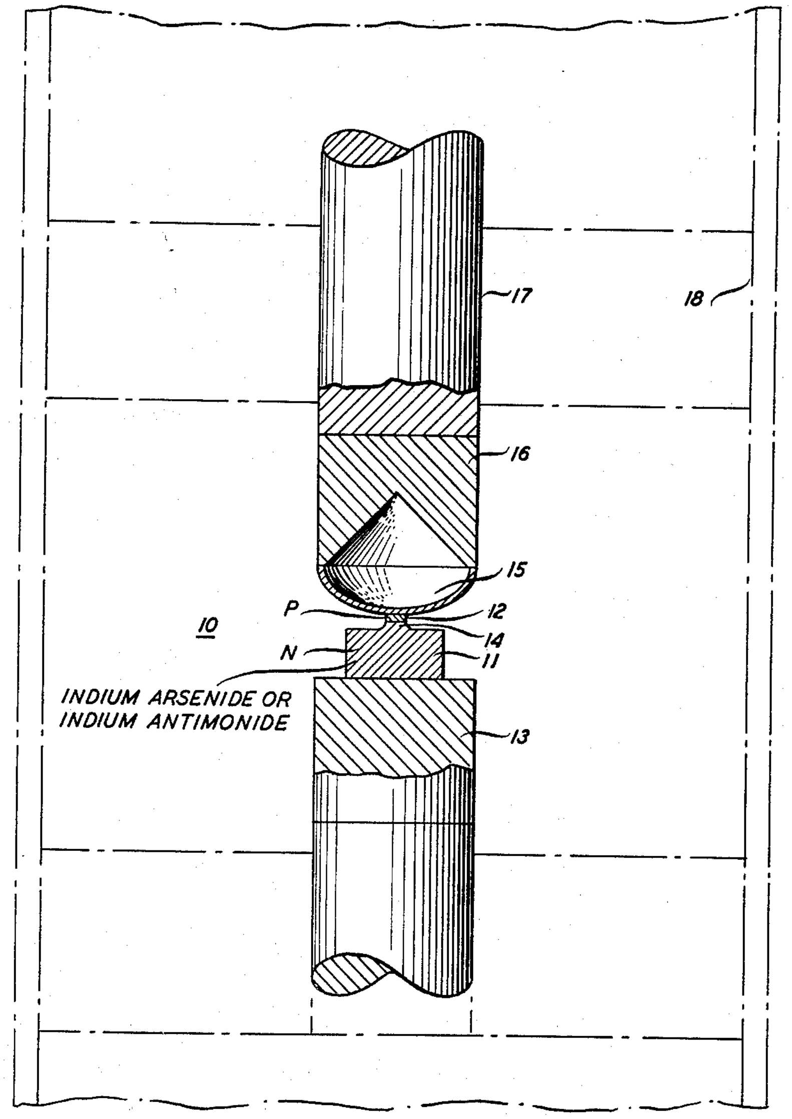
INVENTORS: R. L. BATDORF
G. C. DACEY
D. A. KLEINMAN
BY Arthur J. Torsiglieri
ATTORNEY

United States Patent Office 3,109,758
Patented Nov. 5, 1963

3,109,758
IMPROVED TUNNEL DIODE
Robert L. Batdorf, Berkeley Heights, George C. Dacey, Murray Hill, and David A. Kleinman, Plainfield, N.J., assignors to Bell Telephone Laboratories, Incorporated, New York, N.Y., a corporation of New York
Filed Oct. 26, 1959, Ser. No. 848,573
1 Claim. (Cl. 148—33.1)

This invention relates to semiconductive devices and their fabrication. More particularly, the invention relates to "Esaki" or "tunnel" diodes.

A characteristic of such diodes is a narrow p-n junction separating two degenerate zones such that quantum mechanical tunneling through the junction by conduction band electrons to unoccupied valence band states results in a negative resistance portion in the forward current-voltage characteristic of the diode. Characteristically such a junction is made by an alloy process in order to achieve the minimum junction width.

An object of the invention is a tunnel diode capable of operation at very high frequencies.

It can readily be shown that the upper frequency limit of a tunnel diode is related to its RC product where R is the value of the negative resistance exhibited by the diode in the negative resistance portion of its current-voltage characteristic and C is the capacitance of the p-n junction of the diode. The narrower the junction the lower R and the higher C but the decrease in R is more significant than the increase in C. For this reason, it has been the practice to try to make the junction as narrow as possible. To this end, characteristically in the past such a diode has been formed by alloying an appropriate impurity into a highly doped semiconductive wafer, the alloy process and the impurity being chosen to provide an alloy region in which the impurity concentration is as high as available techniques permit. Typically, the limiting factor is the solid solubility of the impurity in the semiconductive crystal.

With any semiconductor material used, there tends to be a lower limit on the value of the RC product obtainable with available processing techniques. With silicon and germanium it has proven difficult to achieve an RC product significantly less than $10^{-10}$ seconds.

We have found it possible to achieve improved RC products in tunnel diodes by utilizing either indium antimonide or indium arsenide as the semiconductor material. For example, RC products less than $10^{-12}$ have been achieved with indium antimonide.

The improvement made possible by indium antimonide and indium arsenide can be ascribed to the lower effective mass that characterizes the charge carriers in such materials. The lower its effective mass the greater the probability that a charge carrier can penetrate a given width of potential barrier associated with the rectifying junction. This, in turn, means a greater amount of quantum mechanical tunneling and makes possible a lower R for a given junction with or conversely a wider junction width and a lower C for a given R.

However, with these materials we have found it no longer desirable or possible to utilize an alloy process which results in as high an impurity concentration as available techniques permit. In particular, we have found it necessary to control the impurity concentrations in both the alloy region and the bulk portion of the semiconductive wafer if useful tunneling effects are to be achieved reliably.

Specifically, we have found it important in fabricating indium-antimonide and indium-arsenide diodes to dilute the alloy impurity being used, preferably cadmium or also advantageously zinc, in indium. While this tends to reduce the concentration of the impurity in the alloy region below its solid solubility in the semiconductor and also to widen the junction formed, it makes possible a useful tunneling effect.

In particular, in the light of our results we have come to recognize that with materials having a narrow energy gap and a low effective electron mass too high a doping concentration results in so high a penetration of the Fermi level into the appropriate band that such penetration exceeds the gap width. When this occurs, the tunneling current does not experience a sufficient decrease with increasing forward bias over any applied voltage range to result in negative resistance. Based on this recognition, we are able to achieve the desired negative resistance by appropriate control of the impurity levels in the semiconductor crystal. It is important, however, that the doping level in each zone remain sufficiently high that the zone be degenerate, i.e., the Fermi level penetrates the appropriate band rather than being in the band gap.

An illustrative embodiment of the invention includes either an indium-arsenide or an indium-antimonide tunnel diode fabricated by alloying into an n-type crystal an acceptor impurity diluted in indium.

Of the two, the indium-antimonide embodiment has the advantage of being operable at higher frequencies but the disadvantage of requiring refrigeration for use, the indium-arsenide embodiment being operable at room temperature.

The invention will be better understood from the following more detailed description, with reference to the drawing, which shows a tunnel diode in accordance with the invention inserted in the inner conductor of a coaxial line. The diode 10 basically includes a semiconductive wafer whose bulk portion 11 is n-type and which also comprises a p-type alloy region 12.

In particular, a suitable wafer for incorporation in the tunnel diode shown was fabricated of indium antimonide as follows:

There was first obtained a monocrystalline wafer of indium antimonide which was n-type and had a specific resistivity of .001 ohm-centimeter corresponding to a donor density of $2\times10^{17}$ atoms per cubic centimeter. Typically, such material can be obtained by growing material on a seed as it is pulled from the melt which has been suitably doped with sulphur, selenium or tellurium, which act as donors in indium antimonide. It is desirable to grow the crystal in the 111 direction, although the crystal can be grown in any direction, and then later cut in the 111 plane to make available a 111 plane for use as the surface to be alloyed. The use of this crystal plane as the alloy plane facilitates achieving a planar junction as is known to workers in the art.

The wafer was cut to be about 30 mils square and 20 mils thick with one of the square faces corresponding to the 111 crystal plane. Preliminary to forming the alloy junction, the wafer was cleaned by dipping in a suitable etchant, for example, CP-4, which is five parts nitric acid, three parts glacial acetic acid, and three parts hydrofluoric acid, rinsing in deionized water, and drying.

There was then positioned against the center of the square face corresponding to the 111 plane a spherical pellet five mils in diameter. The pellet was of indium which had been doped with about .1 percent cadmium. The wafer with the pellet resting on it was set on a carbon block which, in turn, was mounted on a molybdenum strip heater, and the assembly was put in a bell jar. To exclude the presence of oxygen in the bell jar during alloying, dry, oxygen-free hydrogen was flushed continuously through the bell jar at a positive pressure with respect to the atmosphere from a time five minutes before the alloying cycle. For alloying, the wafer was heated to 325 degrees C., a temperature in excess of the eutectic for the system involved, and kept at this temperature for about a minute. The wafer was cooled by turning off the current to the strip heater and continuing the hydrogen flow.

After the alloying step, a mesa 14 of restricted dimensions, including the rectifying junction, was formed on the alloy plane. To this end, a wax dot two mils in diameter was first centered over the alloy region and the wafer then put in a suitable etchant again, for example, CP–4, for etching away the unprotected surface. The etching was continued for a few seconds to form a mesa about one mil high and two mils in diameter on the large area surface which had served as the alloy plane. The alloy junction accordingly was restricted to an area two mils in diameter.

For achieving a small area junction more directly, it is feasible to deposit the alloying agent on a more limited surface portion of the wafer by evaporation. In such instances, it may be advantageous to deposit the indium and cadmium from separate sources.

To form a tunnel diode 10 of the kind shown, the finished wafer was then centrally mounted on a 50 mil diameter nickel block 13 and the surface opposite that including the mesa 14 soldered to the block with indium solder. The other connection to the wafer was made by pressure contacting the top of the mesa with a mil thick nilvar diaphragm 15 which was supported at the end of a 50 mil diameter nickel pin 16 which has been hollowed out at the end. The diode assembly is shown inserted serially in the inner conductor of a coaxial line which comprises inner conductor 17 and outer conductor 18.

As previously mentioned, it was found necessary in the fabrication of indium-antimonide tunnel diodes to avoid excessive doping despite the fact that the use of lower doping levels tended to some widening of the junction.

In particular, it was found important to avoid doping levels in excess of about $5\times10^{18}$ donors per cubic centimeter on the n-type side. Even better results are obtained when the doping level in this region is kept below about $3\times10^{18}$ donors per cubic centimeter, and optimum results were obtained with a doping level of $2\times10^{18}$ donors per cubic centimeter. Conversely, it was important to keep the doping level in excess of about $3\times10^{16}$ donors per cubic centimeter to insure a satisfactory amount of tunneling.

Additionally, on the p-type side, the regrowth region, it was found important to provide a doping level of between about $10^{17}$ and $10^{20}$ acceptors per cubic centimeter. Optimum results are achieved with a doping level of about $3\times10^{19}$. This compares with a solid solubility of about $10^{22}$ of cadmium in indium antimonide. Doping levels in the useful range were achieved by utilizing as the alloying agent indium doped with from .001 percent to 1.5 percent cadmium. When zinc is the impurity used, to achieve doping levels in the useful range the zinc concentration should be about a factor of ten lower because of its higher solid solubility.

It is found preferably to have the doping level higher on the p-side of the junction than on the n-side. It is for this reason that it is preferred to form a p-type alloy regrowth region in an n-type substrate. However, it is feasible to form useful diodes by using an n-type alloy agent on a p-type substrate. In such an instance, tin indium or lead indium could be used as the alloy agent, the tin and the lead serving as the donor.

The use of indium as the diluent possesses a unique combination of advantages. First, there is facilitated thereby stoichiometric regrowth of the cadmium-doped alloy region. Additionally, its use produces no adverse effects on the conductivity of the alloy region in contrast to other possible diluents, such as lead and tin, which act as donors in the indium antimonide. The use of the indium diluent makes it possible to achieve the desired cadmium concentration while permitting equilibrium freezing. Such equilibrium freezing facilitates reproducibility of results.

The alloy cycle described advantageously was chosen to insure substantially equilibrium freezing and yet to avoid significant diffusion of the cadmium which would tend to widen the junction undesirably. Significant diffusion is avoided by choosing the alloy temperature sufficiently low and by making the alloying time sufficiently short. The shorter the alloying cycle the higher the alloying temperature tolerable. Alloying temperatures from 200 degrees C. to 500 degrees C. are feasible so long as the alloying cycle is properly chosen, typically about a minute for the lower temperature, to several seconds at the higher temperature.

One disadvantage for some applications of a tunnel diode of indium antimonide is the need for refrigerating such a diode, typically to liquid nitrogen temperatures. For example, the tunnel diode shown in FIG. 1 when of indium antimonide advantageously would be mounted in a polyfoam housing through which liquid nitrogen flowed. The lower temperature is needed to keep the normal forward injection current sufficiently low to avoid masking the tunneling current.

The necessity for low temperature operation is avoided by utilization as the basic semiconductor material of indium arsenide whose band gap is about twice that of indium antimonide. Indium arsenide, too, is characterized by a low effective electron mass relative to silicon and germanium so that it possesses the advantage of indium antimonide in this respect.

However, it poses the same problems as does the indium-antimonide diode. In particular, it is important to control within limits the doping levels on both sides of the junction and, accordingly, in fabrication advantageously the alloying agent comprises indium doped either with cadmium or zinc. To this latter end, it is found advantageous to utilize indium as the alloying agent doped with .03 percent to ten percent cadmium to achieve a doping level of between $10^{18}$ and $10^{21}$ in the alloy region. For use with such an alloy region, it is advantageous to have a doping level of between $5\times10^{17}$ and $3\times10^{19}$ in the bulk of the wafer.

As has been indicated above, zinc diluted in indium is also useful as the doping agent in both indium antimonide and indium arsenide.

It is important to maintain the same doping levels discussed above for cadmium doping. However, the different solubility of zinc makes for a difference in the relative proportions of zinc and indium in the alloying agent useful for achieving this doping level in the alloy region.

In particular, with indium antimonide the alloying agent advantageously comprises from .0001 percent to .2 percent zinc with the remainder indium.

For use with indium arsenide the alloying agent advantageously comprises from .01 percent to three percent zinc with the remainder indium.

It is to be understood that the specific embodiments described are merely illustrative of the general principles of the invention. Various modifications are possible within the scope of the invention. In particular, additional junctions may be introduced for various reasons, such as to provide a symmetrical voltage-current characteristic or to increase the impedance to reverse currents, or auxiliary electrodes may be added.

What is claimed is:

A tunnel diode comprising an indium antimonide wafer having contiguous p-type and n-type regions defining therebetween a p-n junction which exhibits quantum-mechanical tunneling, the n-type region having an average donor concentration of about $2\times10^{18}$ per cubic centimeter and the p-type region having an average acceptor concentration of about $3\times10^{19}$ per cubic centimeter.

References Cited in the file of this patent

UNITED STATES PATENTS

| | | |
|---|---|---|
| 2,798,989 | Welker | July 9, 1957 |
| 2,870,052 | Rittman | Jan. 20, 1959 |
| 2,899,343 | Statz | Aug. 11, 1959 |
| 2,908,871 | McKay | Oct. 13, 1959 |
| 2,919,389 | Heywang | Dec. 29, 1959 |
| 2,924,760 | Herlet | Feb. 9, 1960 |

| | | |
|---|---|---|
| 2,956,216 | Jenny et al. | Oct. 11, 1960 |
| 2,967,793 | Philips | Jan. 10, 1961 |
| 3,033,714 | Ezaki et al. | May 8, 1962 |

OTHER REFERENCES

Esaki: Physical Review, volume 109, pages 603 and 604 (1958).

Esaki: Properties of Heavily Doped Germanium and Narrow p-n Junctions; paper delivered at the Brussels conference on Solid State Physics in Electronics and Communications on June 2 to 7, 1958; reprinted in Solid State Physics in Electronics and Telecommunications, volume I, pages 514 through 523.

Johnson and McKay: Bell Telephone System Technical Publications, Monograph 2279.

Johnson and McKay: Physical Review, volume 93, No. 4, Feb. 15, 1954, pages 668 to 672.

Semiconductor Abstracts, volume IV, 1956, pages 14 and 15, abstracts 52 and 53.

Sommers: Proceedings of the I.R.E., July 1959, pages 1201–1206.

Yajima et al.: Journal of the Physical Society of Japan, volume 13, No. 11, pages 1281–1287, November 1958.